(12) United States Patent
McCollum

(10) Patent No.: US 7,718,512 B2
(45) Date of Patent: May 18, 2010

(54) INTEGRATED CIRCUIT WAFER WITH INTER-DIE METAL INTERCONNECT LINES TRAVERSING SCRIBE-LINE BOUNDARIES

(75) Inventor: John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/695,992

(22) Filed: Apr. 3, 2007

(65) Prior Publication Data
US 2007/0184635 A1    Aug. 9, 2007

Related U.S. Application Data

(63) Continuation of application No. 11/171,510, filed on Jun. 29, 2005, now Pat. No. 7,224,042.

(51) Int. Cl.
    H01L 21/00    (2006.01)
(52) U.S. Cl. ............... 438/462; 438/460; 257/E21.523; 257/E21.524
(58) Field of Classification Search ......... 438/460, 438/462; 257/E21.523, E21.524
    See application file for complete search history.

(56) References Cited

U.S. PATENT DOCUMENTS

| | | | |
|---|---|---|---|
| 5,136,354 A | 8/1992 | Morita et al. | |
| 5,943,591 A | 8/1999 | Vokoun et al. | |
| 6,255,729 B1 | 7/2001 | Oikawa | |
| 6,300,223 B1 | 10/2001 | Chang et al. | |
| 6,530,068 B1 | 3/2003 | Cao et al. | |
| 6,562,647 B2 * | 5/2003 | Zandman et al. | 438/33 |
| 6,914,259 B2 | 7/2005 | Sakiyama et al. | |
| 6,936,518 B2 | 8/2005 | Hwang et al. | |
| 7,061,061 B2 | 6/2006 | Goodman et al. | |
| 7,224,042 B1 | 5/2007 | McCollum | |
| 7,284,226 B1 * | 10/2007 | Kondapalli | 716/16 |
| 2002/0001863 A1 * | 1/2002 | Park | 438/14 |
| 2002/0008309 A1 | 1/2002 | Akiyama | |
| 2002/0017718 A1 | 2/2002 | Hikita et al. | |
| 2003/0181045 A1 * | 9/2003 | Minn et al. | 438/689 |
| 2005/0205983 A1 | 9/2005 | Origasa et al. | |
| 2005/0224942 A1 | 10/2005 | Ho | |
| 2006/0071332 A1 | 4/2006 | Speers | |
| 2006/0118959 A1 | 6/2006 | Yamagata | |
| 2006/0237833 A1 | 10/2006 | Klein et al. | |

OTHER PUBLICATIONS

Anonymous, "3D Integration for Mixed Signal Applications," Ziptronix, Inc., 4 pages, 2002(no month).
Anonymous, "Benefits of 3D Integration in Digital Imaging Applications,"Ziptronix, Inc., 3 pages, 2002 (no month).
T. Makimoto, Ph.D., "New Opportunities in the Chip Industry," Semico Summit 2004, Scottsdale, Arizona, 40 pages, Mar. 14-16, 2004.

* cited by examiner

*Primary Examiner*—Alexander G Ghyka
*Assistant Examiner*—Seahvosh J Nikmanesh
(74) *Attorney, Agent, or Firm*—Lewis and Roca LLP

(57) ABSTRACT

A metal interconnect structure formed over a substrate in an integrated circuit that traverses a scribe-line boundary between a first die and a second die includes at least one metal interconnect line that traverses the scribe-line boundary. A switch is coupled between the at least one metal interconnect line and the substrate, the switch having a control element coupled to a scribe-cut control line. The control line turns the switch on if the two dice are separated into individual dice and turns the switch off if the two dice are to remain physically connected so that the interconnect line may be used to make connections between circuits on the two dice.

15 Claims, 2 Drawing Sheets

INTEGRATED CIRCUIT WAFER WITH INTER-DIE METAL INTERCONNECT LINES TRAVERSING SCRIBE-LINE BOUNDARIES

CROSS-REFERENCE TO RELATED APPLICATIONS

This application is a continuation of co-pending U.S. patent application Ser. No. 11/171,510, filed Jun. 29, 2005, the entirety of which is incorporated by reference herein.

BACKGROUND OF THE INVENTION

1. Field of the Invention

The present invention relates to integrated circuit technology and integrated circuit structures. More particularly, the present invention relates to integrated circuit wafers having metal interconnect lines traversing die scribe-line boundaries, integrated circuit dice having metal interconnect lines passing through scribe saw-cut lines and to methods for forming metal interconnect structures traversing scribe-line boundaries.

2. The Prior Art

A major issue relating to integrated circuit dice having metal interconnect lines passing through scribe saw-cut lines is contamination. Referring first to FIGS. 1A and 1B, respectively, a top view and a cross-sectional view of metal interconnect wiring in a portion of a prior-art semiconductor wafer at the edges of two dice disposed thereon shows a typical environment of the present invention.

In general, a structure known as the "die seal" is built at the border between the chip (outside the pads) and the scribe line area of the die. Usually the die seal consists of a substrate tap and a continuous ring of each layer of metal electrically shorted to that tap and tied to ground. This prevents chemical contaminants from seeping into the chip and damaging it during later stages of the manufacturing process, package assembly, testing, PCB assembly, and during its useful lifetime in the target application.

Specifically semiconductor wafer 10 includes a first die 12 that includes a segment 14 of interconnect wiring in a first lower metal layer disposed above a first interlayer dielectric layer 16 formed on substrate 18 and a segment 20 of interconnect wiring in a second upper metal layer disposed above a second upper metal layer. A scribe line (dashed line 26) indicates where the first die 12 is to be separated from a second die 28 including a segment 30 of interconnect wiring in the first lower metal layer disposed above the first interlayer dielectric layer 16 and a segment 32 of interconnect wiring in the second upper metal layer disposed above the second interlayer dielectric layer 22.

A scribe seal metal region is located on first die 12 just inside scribe line 26 (to left of scribe line 26 in FIGS. 1A and 1B). As will be appreciated by persons of ordinary skill in the art, the scribe seal metal region is formed from a portion 34 of the first lower metal layer and a portion 36 of the second upper metal layer. As shown in FIG. 1B, portion 34 of the first lower metal layer makes contact with an n+ doped region 38 in the substrate 18. A similar scribe seal metal region is located on second die 40 just inside of scribe line 26 (to the right of scribe lines 26 in FIGS. 1A and 1B). The scribe seal metal region on second die 40 is formed from a portion 42 of the first lower metal layer and a portion 44 of the second upper metal layer. As shown in FIG. 1B, portion 42 of the lower metal layer makes contact between portion 36 of the lower metal layer and an n+ doped region 46 in the substrate 26. After the wafer containing dices 12 and 40 has been scribed to separate die 12 from die 40, the scribe seals in dice 12 and 40 and the overlying passivation layer 24 together act as border seals to protect the interiors of first die 12 and second die 40 from contamination.

The conventional wisdom is that metal connections that pass through the die seal can potentially serve as conduits for contamination to enter through the protective barrier of the seal, especially if these signals can be at higher voltages than the grounded substrate (as is the case in conventional CMOS circuits). Therefore, metal connections across a die seal are not used in the prior art.

BRIEF DESCRIPTION OF THE INVENTION

A metal interconnect structure formed over a substrate in an integrated circuit that traverses a scribe-line boundary between a first die and a second die includes at least one metal interconnect line that traverses the scribe-line boundary. A switch is coupled between the at least one metal interconnect line and the substrate, the switch having a control element coupled to a scribe-cut control line. The control line turns the switch on if the two dice are separated into individual die and turns the switch off if the two dice are to remain physically connected so that the interconnect line may be used to make connections between circuits on the two dice.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1A:
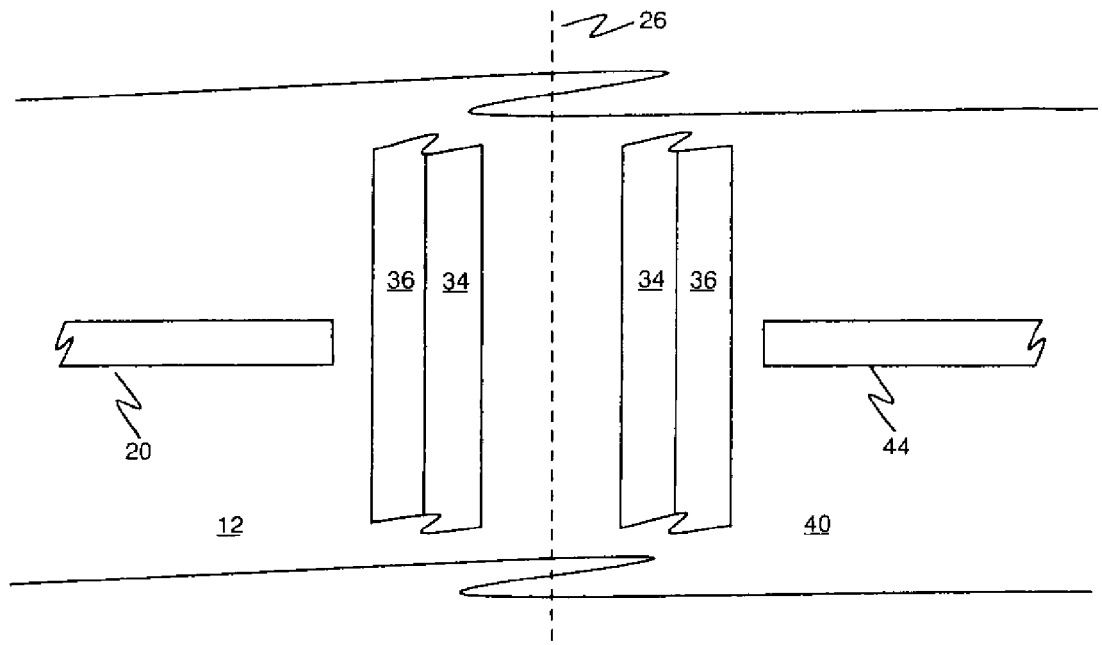
FIGS. 1A and 1B are, respectively, a top view and a cross-sectional view of metal interconnect wiring in a portion of a prior-art semiconductor wafer at the edges of two dice disposed thereon showing a typical environment of the present invention.
Figure 1B:
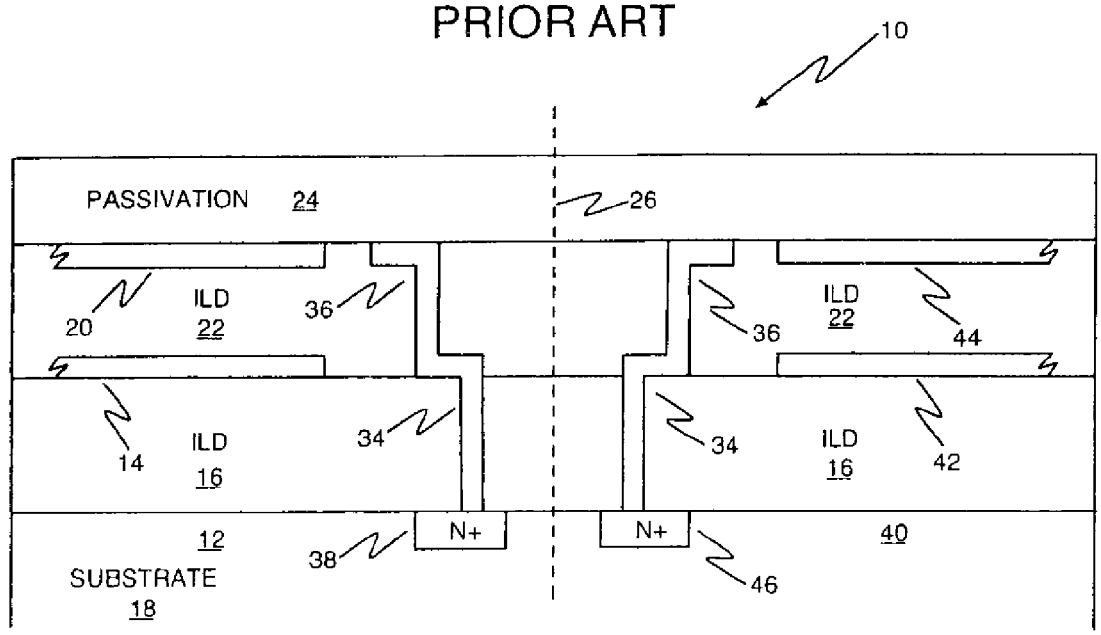
Figure 2A:
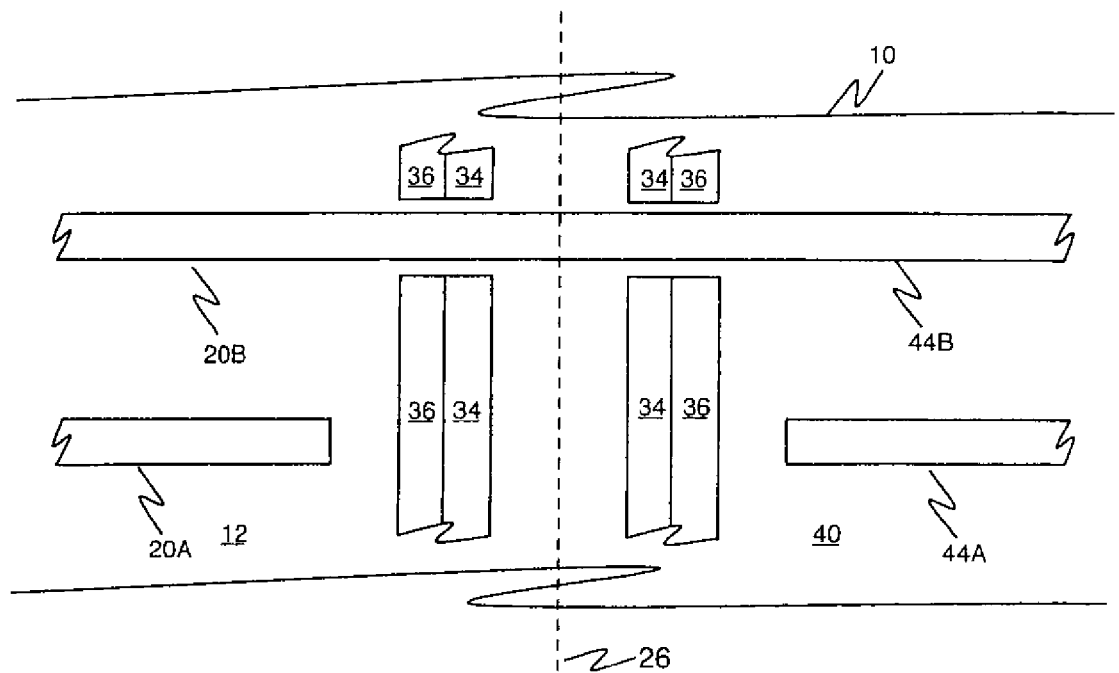
FIGS. 2A and 2B are, respectively, a top view and a cross-sectional view of metal interconnect wiring in a portion of a semiconductor wafer at the edges of two dice disposed thereon illustrating the present invention wherein metal lines may traverse a scribe line boundary along which the integrated circuit die may optionally be split into separate portions.
Figure 2B:
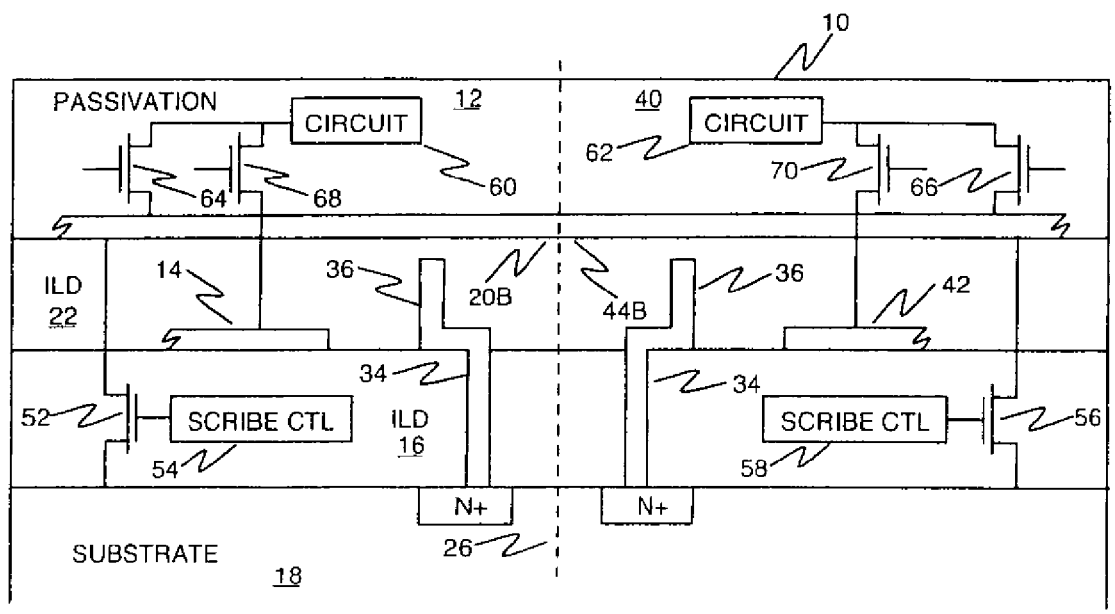

Referring now to FIGS. 2A and 2B, respectively, top and cross-sectional views are shown of metal interconnect wiring in a portion of a semiconductor wafer at the edges of two dice disposed thereon illustrating the present invention wherein metal lines may traverse a scribe line boundary along which the integrated circuit die may optionally be split into two separate portions. Elements of the drawings of FIGS. 2A and 2B that correspond to like elements in FIGS. 1A and 1B will be designated with the same reference numerals used in FIGS. 1A and 1B.

As in FIGS. 1A and 1B, semiconductor wafer 10 of FIGS. 2A and 2B includes a first die 12 that includes a first segment of interconnect wiring 14 in a first lower metal layer overlying a first interlayer dielectric layer 16 disposed on the substrate 18 and a second segment of interconnect wiring 20 in a second upper metal layer overlying a second interlayer dielectric layer 22. A scribe line (dashed line 26) indicates where the first die 12 is to be separated from a second die 40 by a wafer die saw or a scribe and break process, as known in the semiconductor processing art.

A scribe seal metal region is located on first die 12 just inside scribe line 26 (to the left of scribe line 26 in FIGS. 2A and 2B). A similar scribe seal metal region is located on second die 40 just inside of scribe line 26 (to the right of scribe line 26 in FIGS. 2A and 2B). As is most clearly seen in FIG. 2B, the two scribe seals extend to and are in electrical contact with n+ regions 38 and 46, respectively, in substrate 18.

However, unlike the arrangement shown in FIGS. 1A and 1B, and as shown in FIGS. 2A and 2B, the second upper metal layer in first die 12 is shown having a first segment 20A and a second segment 20B. The second upper metal layer in second die 40 is shown having a first segment 44A and a second segment 44B. Segments 20B and 44B are formed from a single segment of deposited metal that extends across scribe line 26. The scribe seals on both dice 12 and 40 are discontinuous around segments 20B and 44B to allow this continuous upper-level metal line to pass through them without being short circuited to the substrate 18.

In addition, first die 12 includes an additional n-channel MOS transistor 52 formed therein, having a drain coupled to the metal line 20B, a source coupled to the substrate 18 and a gate coupled to a scribe-control circuit 54. Scribe-control circuit 54 may be either be programmed or hardwired via a metal mask, etc. to assume a first state in which transistor 52 is turned off if dice 12 and 20 remain together and to assume a second state in which transistor 52 is turned on if dice 12 and 20 are separated into individual dice at scribe line 26.

Similarly, second die 40 includes an additional n-channel MOS transistor 56 formed therein, having a drain coupled to the metal line 44B, a source coupled to the substrate 18 and a gate coupled to a scribe-control circuit 58. Like scribe-control circuit 54 in die 12, scribe-control circuit 58 may also be either be programmed or hardwired via a metal mask, etc. to assume a first state in which transistor 56 is turned off if dice 12 and 40 remain together and to assume a second state in which transistor 56 is turned on if dice 12 and 20 are separated into individual dice at scribe line 26. Persons of ordinary skill in the art will recognize that the transistors and circuits shown in FIG. 2B are not disposed in the passivation layer but are disposed in the substrate, and that, in this respect, FIG. 2B merely indicates the presence of these circuits and not their location.

Thus, if dice 12 and 40 are to remain as a single unit, transistors 52 and 56 are turned off and the continuous metal line running between them identified by reference numeral 20B in first die 12 and reference numeral 44B in second die 40 may be used to make a connection between a circuit located on die 12 and another circuit located on die 40. If, however, dice 12 and 20 are to be separated, then the saw simply buts these interconnections and they would no longer be available. The ends of metal line segments 20B and 44B will be exposed at the edges of first die 12 and second die 40. Transistors 52 and 56 will be turned on, driving metal line segments 16 and 30 in respective dice to the substrate potential. The n-channel MOS transistors 52 and 56 controlled by circuits 54 and 58, act to connect the metal line segments 20B and 44B to the substrate to avoid contamination. Since the relevant contaminants are all positively charges ions, keeping the interconnect line segments 20B and 44B at the substrate voltage will attract the positive ions since they will want to flow to a lower voltage. That way there is no electric field present on these lines during normal operation that could entice the contaminant ions into the part along the metal paths through the insulating materials.

As an example of the usefulness of the present invention, metal line segments 20B and 44B may be used to connect circuit 60 in first die portion 12 to circuit 62 in second die portion 40 by turning on n-channel MOS transistor 64 in first die portion 12 to couple metal line segment 20B to circuit 60 and turning on n-channel MOS transistor 66 in second die portion 40 to couple metal line segment 44B to circuit 62 if the first and second die portions 12 and 20 remain together. If first and second die portions 12 and 40 are separated, n-channel MOS transistors 64 and 66 are turned off. In this case, n-channel MOS transistor 68 in first die portion 12 may be turned on to couple local metal line segment 14 to circuit 60, and n-channel MOS transistor 70 in second die portion 40 may be turned on to couple local metal line segment 42 to circuit 62. The gate connections to n-channel MOS transistors 64, 66, 68, and 70 are not shown, but persons of ordinary skill in the art will appreciate that, as a simple example, n-channel MOS transistors 64 and 68 may be connected to scribe control circuit 54 in first die portion 12 and that the gates of n-channel MOS transistors 66 and 70 may be connected to scribe control circuit 58 in second die portion 40. In more complex systems, any one of a number of well-known programming-control circuits may be used to control the operation of n-channel MOS transistors 64, 66, 68, and 70. Persons of ordinary skill in the art will appreciate that, while metal lines (14 and 42) in the lower metal layer is shown making the connections for circuits, such connections could easily be made according to the present invention using metal line segments in the upper metal layer.

Two other materials-based approaches may be employed in the present invention. One is to use highly doped glass (with boron or phosphorous) or plasma nitride (otherwise known as nitrox) as the inter-metal layer insulator. These materials will repel the positively charged contaminants. The other is to apply a sealant after the die-cut operation. The use of such highly doped glass or plasma nitride materials as the inter-metal layer insulators is not easy to make compatible with the more recent low-K dielectrics available with the deep submicron processes.

The structure and method of the present invention are useful in numerous applications. Memory integrated circuits could be sized to memory capacity by separating adjacent die portions on a wafer. Each die portion could contain the addressing and other circuitry necessary for reading and writing to the memory cells on that die portion, and that circuitry could be enabled/disabled using the scribe-control circuits depending on whether or not the die portion remains connected to an adjacent die portion.

For example, two dice could each contain a 1-MB SRAM memory array. When the dice remain connected to one another, the addressing and other circuitry necessary for reading and writing to the memory cells on the second (slave) die portion could be disabled using the scribe-control circuits on the second die portion, allowing the addressing and other circuitry necessary for reading and writing to the memory cells disposed on the first (master) die portion to control those functions directly on the first die portion and also on the second die portion through inter-scribe-line interconnect lines as disclosed herein. If, however, the dice are separated, the addressing and other circuitry necessary for reading and writing to the memory cells on the second die portion could be enabled using the scribe-control circuits on the second die portion, allowing the addressing and other circuitry necessary for reading and writing to the memory cells disposed on the second die portion to locally control those functions on the second die portion so it can function as a stand-alone memory array.

DSP and processor bit-slice sizes could likewise be implemented using the principles of the present invention, using the scribe control circuits on the individual dice to both decouple and enable control functions for the individually segmented dice.

As will be appreciated by persons of ordinary skill in the art, a large variety of analog, as well as digital, integrated circuit functions could benefit from use of the present invention. This would allow providing single-die and multiple-die circuit functionality and the cost and performance advantages that such modular integration provides.

An interesting application of the present invention is to provide a modular family of "tiles" daughter chips that me be face-to-face mounted on a substrate, wherein multiple-die daughter-chip tiles can be used to selectively provide a family of circuits, such as field-programmable-gate-alTay (FPGA) multi-chip systems. Use of the present invention in such a system is disclosed in copending application Ser. No. 11/171,488, filed Jun. 29, 2005, entitled ARCHITECTURE FOR FACE-TO-FACE BONDING BETWEEN SUBSTRATE AND MULTIPLE DAUGHTER CHIPS, assigned to the same assignee of the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A method for protecting from contamination a metal line that crosses a scribe boundary on an integrated circuit die having a substrate, the method comprising:
    separating the die from adjacent die to create an exposed metal line;
    disconnecting the exposed metal line from circuitry formed on the die; and
    connecting the exposed metal line to the substrate in the die.

2. The method of claim 1 wherein connecting the exposed metal line to the substrate in the die comprises turning on a transistor coupled between the exposed metal line and the substrate.

3. The method of claim 2 wherein turning on the transistor comprises driving the transistor from a scribe-control circuit disposed on the die.

4. The method of claim 3 wherein driving the transistor from a scribe-control circuit disposed on the die comprises programming the scribe-control circuit to provide a signal to the transistor.

5. The method of claim 4 wherein programming the scribe-control circuit to provide a signal to the transistor comprises programming a programmable element associated with the scribe-control circuit.

6. The method of claim 4 wherein programming the scribe-control circuit to provide a signal to the transistor comprises mask programming the scribe-control circuit.

7. The method of claim 1 wherein disconnecting the metal line from circuitry formed on the die comprises turning off a transistor coupled between the metal line and the circuitry.

8. The method of claim 7 wherein turning off the transistor comprises driving the transistor from a scribe-control circuit disposed on the die.

9. A method for protecting from contamination a die formed on a substrate and having a metal line that crosses a scribe boundary comprising:
    providing a scribe-control transistor on the die connected between the metal line and the substrate;
    separating the die from adjacent die to create an exposed metal line; and
    turning on the scribe-control transistor to connect the exposed metal line to the substrate in the die.

10. The method of claim 9 wherein turning on the scribe-control transistor to connect the exposed metal line to the substrate in the die comprises activating a scribe-control circuit on the die coupled to the scribe-control transistor.

11. The method of claim 9 wherein providing a scribe-control transistor on the die connected between the exposed metal line and the substrate comprises providing an n-channel scribe-control transistor on the die having a source connected to the substrate, a drain connected to the exposed metal line, and a gate.

12. The method of claim 11 further including:
    providing a scribe-control circuit on the die coupled to the gate of the n-channel scribe-control transistor; and
    activating the scribe-control circuit when the die is to be separated from an adjacent die to which the exposed metal line extends.

13. The method of claim 12 wherein activating the scribe-control circuit comprises programming the scribe-control circuit.

14. The method of claim 13 wherein programming the scribe-control circuit comprises mask programming the scribe-control circuit.

15. The method of claim 13 wherein programming the scribe-control circuit comprises programming a programmable element associated with the scribe-control circuit.

* * * * *